(12) United States Patent
Houvenaghel et al.

(10) Patent No.: US 9,899,815 B2
(45) Date of Patent: Feb. 20, 2018

(54) REMOVABLE CABLE INLET

(71) Applicant: Connecteurs Electriques Deutsch, Evreux (FR)

(72) Inventors: Fabien Houvenaghel, Evreux (FR); Didier Quin, St. Julien (FR); Christian Cavailles, Gravigny (FR)

(73) Assignee: Connecteurs Electriques Deutsch, Evreux (FR)

( * ) Notice: Subject to any disclaimer, the term of this patent is extended or adjusted under 35 U.S.C. 154(b) by 0 days.

(21) Appl. No.: 15/275,942

(22) Filed: Sep. 26, 2016

(65) Prior Publication Data
US 2017/0012420 A1 Jan. 12, 2017

Related U.S. Application Data

(63) Continuation of application No. PCT/EP2015/055607, filed on Mar. 18, 2015.

(30) Foreign Application Priority Data

Mar. 26, 2014 (EP) ..................... 14290079

(51) Int. Cl.
*H02G 3/18* (2006.01)
*H02G 3/08* (2006.01)
*H02G 15/007* (2006.01)
*H05K 5/02* (2006.01)
*H02G 3/22* (2006.01)

(52) U.S. Cl.
CPC .......... *H02G 3/083* (2013.01); *H02G 15/007* (2013.01); *H05K 5/0247* (2013.01); *H02G 3/22* (2013.01)

(58) Field of Classification Search
CPC ...... H02G 3/0691; H02G 3/06; H02G 3/0616; H02G 3/083; H02G 3/22; H02G 3/26; H02G 15/007; H02G 15/00; H02G 15/064; H02G 15/068; H05K 5/0247; H05K 5/02; H01R 13/58; H01R 13/5816
USPC ....... 174/650, 653, 654, 656, 660, 659, 665, 174/64, 153 G, 152 G, 68.1, 68.3; 248/49, 68.1; 16/2.1, 2.2
See application file for complete search history.

(56) References Cited

U.S. PATENT DOCUMENTS

| | | | |
|---|---|---|---|
| 3,732,527 A | 5/1973 | McKnight | |
| 5,739,475 A * | 4/1998 | Fujisawa | H02G 3/088 174/153 G |
| 5,908,180 A | 6/1999 | Daoud | |
| 6,114,630 A * | 9/2000 | Gretz | H05K 13/00 174/660 |

(Continued)

FOREIGN PATENT DOCUMENTS

| DE | 19908657 C1 | 2/1999 |
|---|---|---|
| WO | 2012007065 A1 | 1/2012 |

OTHER PUBLICATIONS

European Search Report, dated Oct. 7, 2014, 7 pages.
(Continued)

*Primary Examiner* — Angel R Estrada
(74) *Attorney, Agent, or Firm* — Barley Snyder

(57) ABSTRACT

A cable inlet is disclosed. The cable inlet has a tubular body and a cable inlet interface region. The cable inlet interface region is removably mounted in a housing interface region of a housing and has a plurality of protrusions abutting the housing. The plurality of protrusions prevents a rotation of the tubular body with respect to the housing.

22 Claims, 3 Drawing Sheets

(56) References Cited

U.S. PATENT DOCUMENTS

| | | | | |
|---|---|---|---|---|
| 6,335,488 B1* | 1/2002 | Gretz | ................... | H02G 3/0691 |
| | | | | 174/650 |
| 6,521,833 B1* | 2/2003 | DeFreitas | ............ | H02G 3/0691 |
| | | | | 174/660 |
| 6,827,604 B1* | 12/2004 | White | ................... | H02G 3/083 |
| | | | | 174/655 |
| 7,824,213 B1* | 11/2010 | Korcz | ................ | H01R 13/5816 |
| | | | | 174/64 |
| 8,350,163 B2* | 1/2013 | Auray | ................... | H02G 3/0691 |
| | | | | 174/650 |
| 8,791,374 B1* | 7/2014 | Smith | ................... | H02G 3/0616 |
| | | | | 174/530 |
| 8,791,377 B2* | 7/2014 | Jafari | ................... | H02G 3/0691 |
| | | | | 174/660 |

OTHER PUBLICATIONS

International Search Report and Written Opinion of the International Searching Authority, dated Aug. 24, 2015, 10 pages.
Abstract of DE19908657, dated Oct. 19, 2000, 1 page.

* cited by examiner

REMOVABLE CABLE INLET

CROSS-REFERENCE TO RELATED APPLICATION

This application is a continuation of PCT International Application No. PCT/EP2015/055607, filed on Mar. 18, 2015, which claims priority under 35 U.S.C. § 119 to European Patent Application No. 14290079.4, filed on Mar. 26, 2014.

FIELD OF THE INVENTION

The present invention relates to a cable inlet, and more particularly, to a removable cable inlet of an electrical component enclosure assembly.

BACKGROUND

Enclosure assemblies are commonly used for surrounding electrical components, such as electrical lines, terminals attached thereto and electronic devices, in order to protect them against detrimental environmental influences such as shock, dirt and moisture. Enclosure assemblies comprise housings providing an interior space and cable inlets for leading wire beams into such housings. Known cable inlets having a tubular body and various accessories are commonly mounted on or into housing bodies to form the enclosure assemblies.

FIG. 1 shows a known enclosure assembly 1 comprising a housing 3 and one or more openings 7 on at least one of its sides. The housing 3 also has an interior surface 5 covered by a conductive plating, for example, nickel. The one or more openings 7 receive one or more removable cable inlets 2. The housing 3 can be closed with a cover, not shown in FIG. 1, which also has a conductive plating.

The cable inlet 2 comprises a tubular body 9 for leading wire beams (not shown) into the housing 3. The tubular body 9 has an interface region 11 on a first end for mounting the cable inlet 2 onto or into a mating housing interface region 13 defining the openings 7 of the housing 3. The interface region 11 of the tubular body 9 comprises connection collars 15, 17 fixing the tubular body 9 to the housing 3 by a form-fitted connection. The tubular body 9 is made of a metallic material, for example, stainless steel or aluminum. A metallic contact spring 19 for ensuring an electric connection between the housing 3 and the tubular body 9 is provided in a groove 21 in the interface region 11. A tie-wrap receiving section 23 is provided on an opposite second end of the tubular body 9.

In the known enclosure assembly 1, the plating on the interior surface 5 of the housing 3 wears off close to the mating housing interface region 13. Thus, there is a risk that an interruption of the electric continuity between the tubular body 9 and the housing 3 could occur.

SUMMARY

An object of the invention, among others, is to provide a cable inlet which better protects an interior surface region of a housing against wear. The disclosed cable inlet has a tubular body and a cable inlet interface region. The cable inlet interface region is removably mounted in a housing interface region of a housing and has a plurality of protrusions abutting the housing. The plurality of protrusions prevents a rotation of the tubular body with respect to the housing.

BRIEF DESCRIPTION OF THE DRAWINGS

The invention will now be described by way of example with reference to the accompanying figures, of which.

DETAILED DESCRIPTION OF THE EMBODIMENT(S)

The invention is explained in greater detail below with reference to embodiments of a cable inlet. This invention may, however, be embodied in many different forms and should not be construed as limited to the embodiments set forth herein; rather, these embodiments are provided so that this disclosure will be thorough and complete and still fully convey the scope of the invention to those skilled in the art.

Figure 1:
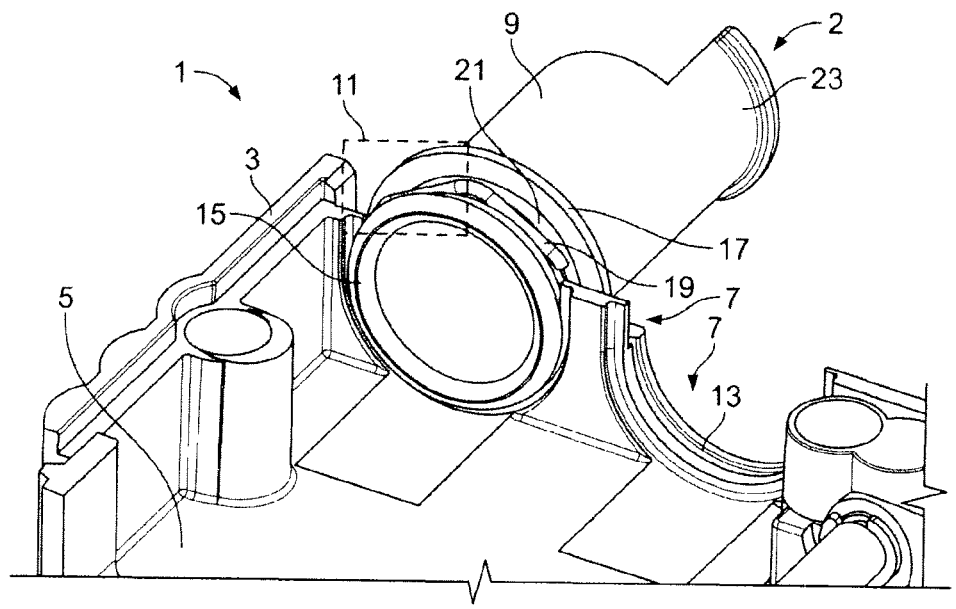
FIG. 1 is a perspective view of a cable inlet according to the prior art mounted in a housing body.
Figure 2:
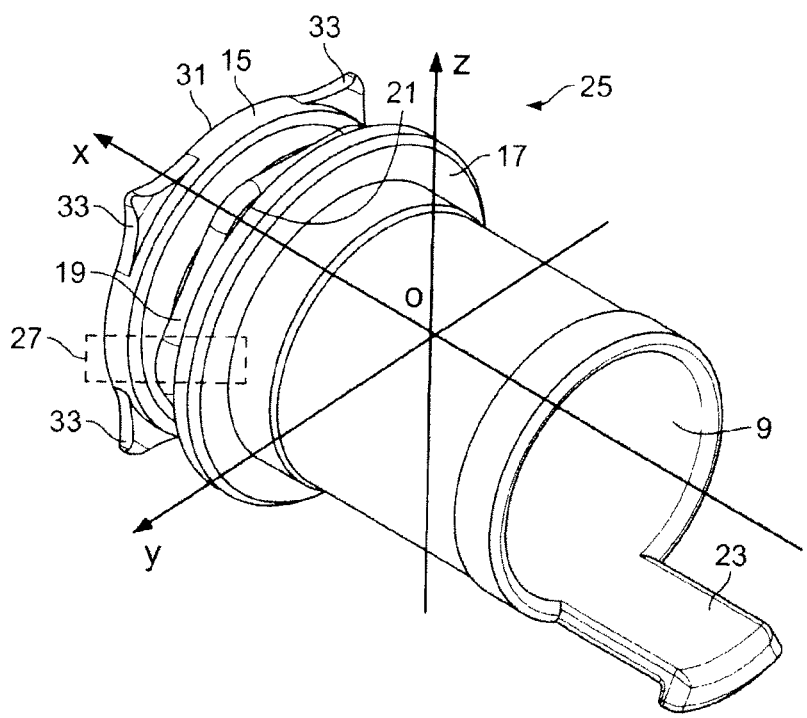
FIG. 2 is a perspective view of a cable inlet according to an embodiment of the invention.

A cable inlet 25 according to the invention is shown generally in FIG. 2. The cable inlet 25 has a tubular body 9 and a cable inlet interface region 27. The major components of the invention will now be described in greater detail.

A longitudinal direction x, a transverse direction y and a height direction z is assigned to the cable inlet 25, in order to better describe the present invention. The longitudinal direction x, the transverse direction y, and the height direction z extend perpendicular with respect to each other such that they may be regarded as a Cartesian coordinate system The tubular body 9, in the embodiment shown in FIG. 2, has a cylindrical shape. The tubular body 9 may be made out of a conductive material, for example, a metal such as aluminum or an alloy like stainless steel. The tubular body 9 has an extension 23 extending from a second end of the tubular body 9. In the shown embodiment, the extension 23 is formed integrally with the tubular body 9.

The cable inlet interface region 27 is formed on an opposite first end of the tubular body 9. The cable inlet interface region 27 has a first connection collar 15, a second connection collar 17, a groove 21 having a contact spring 19, and a plurality of protrusions 33.

Figure 3:
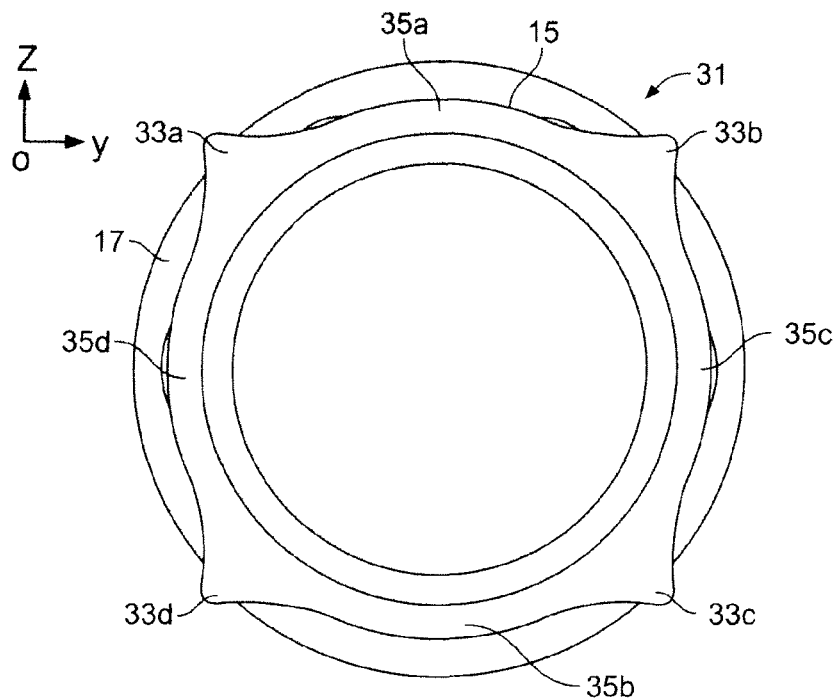
FIG. 3 is a front view of the cable inlet of FIG. 2.
Figure 4:
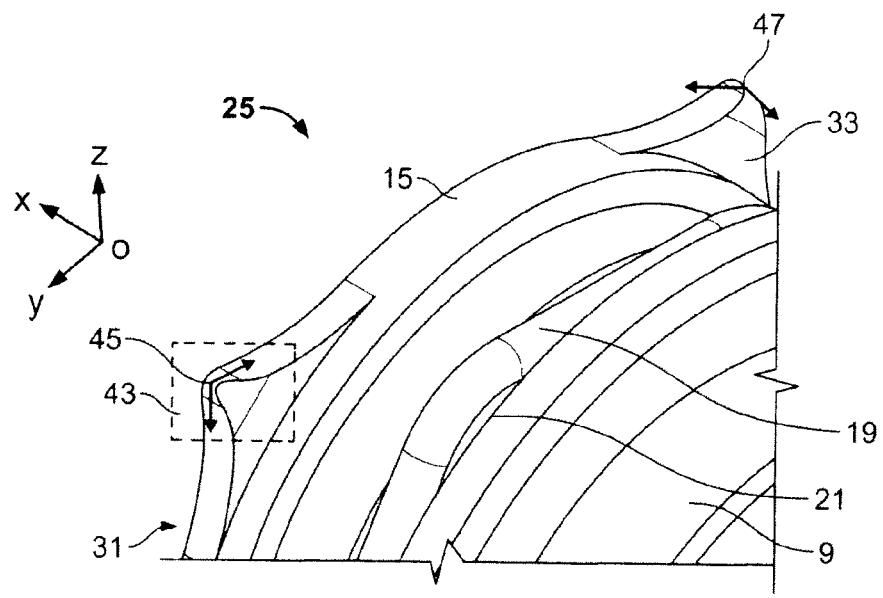
FIG. 4 is a detail perspective view of the cable inlet of FIG. 2.

The first connection collar 15 and the second connection collar 17, as shown in FIGS. 2-4, extend circumferentially around and orthogonally to the tubular body 9. The first connection collar 15 and the second connection collar 17, in the shown embodiment, are both circular members. As shown in FIG. 3, the second connection collar 17 may extend further from the tubular body 9 than the first connection collar 15.

The groove 21 having the contact spring 19 is disposed between the first connection collar 15 and the second connection collar 17. The contact spring 19 may be formed from a metallic material such as nickel.

The plurality of protrusion 33, as shown in FIG. 2, comprises a rotation prevention means 31. As shown in FIG. 3, the protrusions 33 are arranged essentially in a plane yOz perpendicular to an axis Ox corresponding to the rotational symmetry axis of the tubular body 9. The plurality of protrusions 33, as shown in FIG. 3, may comprise four protrusions 33a, 33b, 33c, 33d arranged to extend outwardly from the cable inlet interface region 27. A plurality of ring segments 35a, 35b, 35c, 35d, which may be portions of the first connection collar 15, are disposed between the four protrusions 33a, 33b, 33c, and 33d, with each of the plurality of ring segments 35a, 35b, 35c, 35d arranged between two adjacent protrusions 33a, 33b, 33c, 33d. Each of the plurality of ring segments 35a, 35b, 35c, 35d has the same size, encompassing the same angular range. The plurality of protrusions 33 may be disposed equidistant from one another. The plurality of protrusions 33 has four-fold symmetry when looking along axis Ox as shown in FIG. 3. In other embodiments, depending on the number of protrusions 33, the plurality of protrusions 33 may have a two, three, five, six or more fold symmetry. As shown in FIG. 4, the protrusions 33 have rounded edges 45, 47 both in the plane yOz perpendicular to the rotation axis Ox and in a plane xOz. The edges 45, 47, may alternatively be beveled.

The plurality of protrusions 33, as shown in FIG. 4, is positioned on the first connection collar 15 at an end of the cable inlet interface region 27. In other embodiments, the plurality of protrusions 33 could be positioned on the second connection collar 17 or on both the first connection collar 15 and the second connection collar 17.

The assembly and use of the cable inlet 25 as part of an enclosure assembly 51 will now be described in greater detail with reference to FIGS. 5 and 6.

Figure 5:
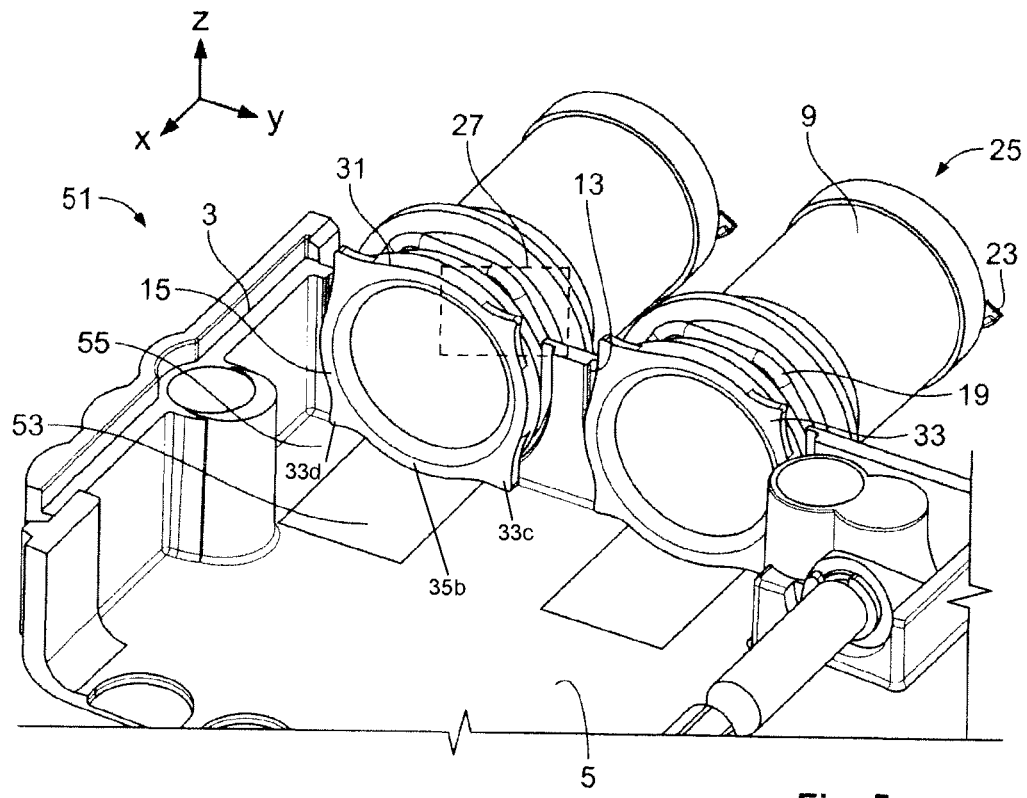
FIG. 5 is a perspective view of the cable inlet of FIG. 2 in a housing according to the invention.

The enclosure assembly 51, as shown in FIG. 5, has a housing 3 with one or more openings 7 each having a mating housing interface region 13 receiving one cable inlet 25. The housing 3 shown in FIG. 5 is depicted open, but can be closed with a cover (not shown) also having a mating interface region to completely enclose the cable inlet interface region 27 of the cable inlet 25. The housing 3 is positioned such that sidewalls of the housing 3, comprising bottom and top side walls, are aligned with planes xOy, yOz and xOz.

The cable inlet 25 is removably mounted in the housing 3, with the cable inlet interface region 27 of the cable inlet 25 disposed in one of the housing interface regions 13. The first and second connection collars 15, 17 together with the contact spring 19 are positioned such that the first and second connection collars 15, 17 are disposed on each side of a side wall of the housing 3. A form fitted connection is achieved between the housing 3 and the cable inlet 25 in the direction Ox. The contact spring 19 elastically abuts the housing 3 and forms an electrical connection between the housing 3 and the cable inlet 25.

As shown in FIG. 5, the plurality of protrusions 33 are positioned inside the housing 3 on the first connection collar 15. In other embodiments described above, some of the protrusions 33 could be positioned outside the housing 3 on the second connection collar 17. The ring segment 35b is disposed in a mating circular segment 53 on a bottom surface 55 of the housing 3, which is essentially flat on both sides of the mating circular segment 53. As shown in FIG. 5, both segments 35b and 53 cover the same angular range such that the protrusions 33d and 33c abut the flat part of the bottom surface 55 of the housing 3, preventing rotation of the cable inlet 25 with respect to the housing 3.

The extension 23 is arranged such that in the mounted state of the cable inlet 25, the extension 23 is in a predetermined position, here aligned with plane xOz. The cable inlet 25 could also be mounted in a different manner into the housing 3, namely by turning it by 90°, 180° or 270° around Ox. Thus, four different predetermined positions for the extension 23 are available for this embodiment. The extension 23 can be aligned with the bottom surface 55, the top surface (not shown), or the sidewalls of the housing 3. In case of more or less protrusions 33, more predetermined positions would be available. A wire beam (not shown) can be attached to the extension 23 using a tie wrap (not shown) known in the art.

Figure 6:
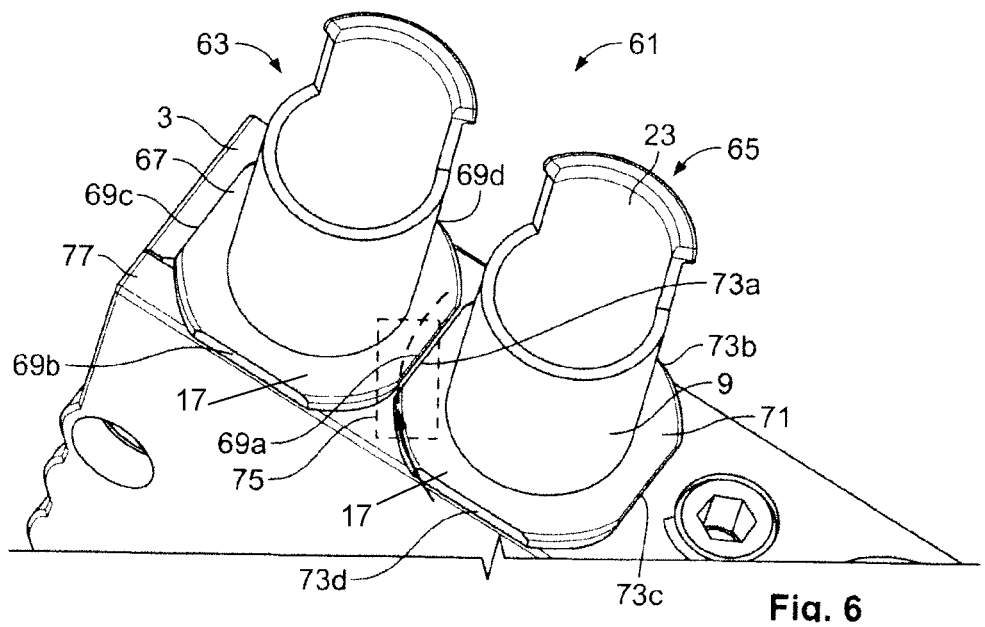
FIG. 6 is a perspective view of a cable inlet according to the invention in a housing according to the invention.

An enclosure assembly 61 according to another embodiment of the invention is shown in FIG. 6. The enclosure assembly 61 comprises a housing 3, at least two removable cable inlets 63, 65 and a cover 77 to close the housing 3 and fix the cable inlets 63 and 65.

A first cable inlet 63 has a plurality of first rotation prevention members 69 comprising a first rotation prevention means 67. A second cable inlet 65 has a plurality of second rotation prevention members 73 comprising a second rotation prevention means 71. In the shown embodiment, the plurality of first rotation prevention members 69 may comprise four first rotation prevention members 69a, 69b, 69c, and 69d and the plurality of second rotation prevention members 73 may comprise four second rotation prevention members 73a, 73b, 73c, and 73d. The first and second rotation prevention members 69a-d and 73a-d are formed as straight edges on the connection collar 17 perpendicular to the rotation axes Ox of the cable inlets 63 and 65. The first and second rotation prevention members 69a-d and 73a-d are shown positioned outside the housing 3, but could alternatively be positioned inside the housing 3 instead or in addition to being positioned outside the housing 3.

As shown in FIG. 6, one of the first rotation prevention members 69a, 69b, 69c, or 69d abuts one of the second rotation prevention members 73a, 73b, 73c, or 73d. That is, one of the first rotation prevention members 69a, 69b, 69c, or 69d is positioned in a rotation trajectory 75 of the plurality of second rotation prevention members 73, and one of the second rotation prevention members 73a, 73b, 73c, or 73d is positioned in a rotation trajectory of the plurality of first rotation prevention members 69. Consequently, in the enclosure assembly 61, rotation of the first and second cable inlets 63, 65 is prevented by the shapes of the first and second cable inlets 63 and 65.

Advantageously, in the cable inlets according to the invention, rotational movements of the cable inlet within the housing are reduced without changing the housing. Consequently, frictional forces due to rotational movements between the cable inlet and the housing can be suppressed, and the contact spring does not damage plating on the inside of the housing. The lifetime of the enclosure assembly is thus superior to the one of the prior art. Furthermore, as the cover of the housing has a similar mating interface region, the same effect can be observed at the interface between the cover and the cable inlet.

What is claimed is:
1. A cable inlet, comprising:
   a tubular body; and
   a cable inlet interface region removably mounted in a housing interface region of a housing and having
      a connection collar extending orthogonally from the tubular body and circumferentially around the tubular body, and
      a plurality of protrusions disposed on the connection collar and extending parallel to the connection collar, the plurality of protrusions abutting the housing and preventing a rotation of the tubular body with respect to the housing.
2. The cable inlet of claim 1, wherein the cable inlet interface region is form fitted to the housing interface region.

3. The cable inlet of claim 1, wherein the cable inlet interface region is symmetrical about a rotation axis of the tubular body.

4. The cable inlet of claim 1, wherein the plurality of protrusions extend perpendicular to a rotation axis of the tubular body.

5. The cable inlet of claim 4, wherein the plurality of protrusions extend outwardly from the cable inlet interface region.

6. The cable inlet of claim 5, wherein the plurality of protrusions have a two, three, four, five, or six fold symmetry.

7. The cable inlet of claim 5, further comprising a plurality of ring segments disposed between the plurality of protrusions.

8. The cable inlet of claim 7, wherein the plurality of protrusions are disposed equidistant from one another.

9. The cable inlet of claim 5, wherein each of the plurality of protrusions has a rounded edge.

10. The cable inlet of claim 1, wherein the cable inlet interface region has a contact spring.

11. The cable inlet of claim 10, wherein the contact spring electrically connects the housing and the cable inlet.

12. The cable inlet of claim 1, wherein an extension extends from an end of the tubular body.

13. The cable inlet of claim 12, wherein the extension is aligned with a surface of the housing when the cable inlet interface region is mounted in the housing interface region.

14. The cable inlet of claim 1, wherein the cable inlet extends through a sidewall of the housing and the connection collar is disposed in an interior of the housing.

15. The cable inlet of claim 14, wherein the plurality of protrusions abut a bottom surface of the housing in the interior of the housing.

16. The cable inlet of claim 15, wherein the bottom surface of the housing has a circular segment and the cable inlet interface region has a ring segment disposed between a pair of the plurality of protrusions, the ring segment mating with the circular segment.

17. A cable inlet, comprising:
 a tubular body; and
 a cable inlet interface region removably mounted in a housing interface region of a housing and having
  a connection collar extending orthogonally from the tubular body and circumferentially around the tubular body, and
  a plurality of straight edges on the connection collar preventing a rotation of the tubular body with respect to the housing.

18. The cable inlet of claim 17, wherein the plurality of straight edges extend perpendicular to a rotation axis of the tubular body.

19. An enclosure assembly, comprising:
 a housing having a housing interface region; and
 a cable inlet having a tubular body and a cable inlet interface region removably mounted in the housing interface region, the cable inlet interface region having a connection collar extending orthogonally from the tubular body and circumferentially around the tubular body and a plurality of protrusions disposed on the connection collar and extending parallel to the connection collar, the plurality of protrusions abutting the housing and preventing a rotation of the tubular body with respect to the housing.

20. The enclosure assembly of claim 19, wherein the plurality of protrusions are positioned inside the housing at an end of the cable inlet interface region.

21. The enclosure assembly of claim 19, wherein the housing interface region has a circular segment mating with a ring segment of the cable inlet interface region.

22. An enclosure assembly, comprising:
 a housing having a plurality of housing interface regions; and
 a plurality of cable inlets, each of the plurality of cable inlets having a cable inlet interface region removably mounted in one of the plurality of housing interface regions and a plurality of straight edges on a connection collar, one of the plurality of straight edges positioned in a rotation trajectory of an adjacent one of the plurality of cable inlets.

* * * * *